US008867206B2

(12) United States Patent (10) Patent No.: US 8,867,206 B2
Hruby et al. (45) Date of Patent: Oct. 21, 2014

(54) TELECOMMUNICATION CABINET WITH AIRFLOW DUCTING

(75) Inventors: Kevin L. Hruby, Minnetonka, MN (US); Neal Schook, Shakopee, MN (US); Glen Cordle, Edina, MN (US)

(73) Assignee: ADC Telecommunications, Inc., Berwyn, PA (US)

( * ) Notice: Subject to any disclaimer, the term of this patent is extended or adjusted under 35 U.S.C. 154(b) by 24 days.

(21) Appl. No.: 12/803,624

(22) Filed: Jun. 29, 2010

(65) Prior Publication Data
US 2011/0111686 A1 May 12, 2011

Related U.S. Application Data

(63) Continuation of application No. 11/799,099, filed on Apr. 30, 2007, now Pat. No. 7,764,495.

(51) Int. Cl.
*H05K 7/20* (2006.01)
*H04Q 1/02* (2006.01)

(52) U.S. Cl.
CPC .......... *H05K 7/20572* (2013.01); *H04Q 1/025* (2013.01); *H04Q 1/035* (2013.01)
USPC .... 361/692; 361/679.46; 454/184; 312/223.2

(58) Field of Classification Search
USPC .................. 361/679.46–679.54, 688–722
See application file for complete search history.

(56) References Cited

U.S. PATENT DOCUMENTS

| | | | |
|---|---|---|---|
| 6,104,003 A | 8/2000 | Jones | |
| 6,151,210 A * | 11/2000 | Cercioglu et al. | 361/690 |
| 7,508,663 B2 | 3/2009 | Coglitore | |
| 7,659,476 B2 | 2/2010 | Hruby et al. | |
| 7,697,285 B2 | 4/2010 | Donowho et al. | |
| 7,746,637 B2 | 6/2010 | Donowho et al. | |
| 7,764,495 B2 * | 7/2010 | Hruby et al. | 361/692 |
| 7,839,635 B2 | 11/2010 | Donowho et al. | |
| 8,405,984 B2 | 3/2013 | Donowho et al. | |
| 2004/0114326 A1 | 6/2004 | Dodgen et al. | |
| 2004/0182799 A1 * | 9/2004 | Tachibana | 211/26 |
| 2006/0276121 A1 * | 12/2006 | Rasmussen | 454/184 |
| 2007/0053162 A1 * | 3/2007 | Keenan et al. | 361/700 |
| 2007/0064389 A1 | 3/2007 | Lewis, II et al. | |
| 2007/0064391 A1 | 3/2007 | Lewis, II et al. | |
| 2007/0171610 A1 * | 7/2007 | Lewis | 361/691 |
| 2007/0173189 A1 * | 7/2007 | Lewis | 454/184 |
| 2008/0316702 A1 | 12/2008 | Donowho et al. | |
| 2008/0316703 A1 * | 12/2008 | Donowho et al. | 361/695 |
| 2009/0129013 A1 * | 5/2009 | Donowho et al. | 361/690 |
| 2011/0148261 A1 | 6/2011 | Donowho et al. | |

FOREIGN PATENT DOCUMENTS

FR 2.193.303 5/1974

OTHER PUBLICATIONS

Panduit® *Net-Access*™ Cabinet; Brochure No. SA-RKCB06; 8 pages; dated Aug. 2006.

* cited by examiner

*Primary Examiner* — Courtney Smith

(74) *Attorney, Agent, or Firm* — Merchant & Gould P.C.

(57) ABSTRACT

A telecommunications cabinet in which active equipment can be mounted. The cabinet including an airflow ducting arrangement located in the interior region of the cabinet. The airflow ducting arrangement accommodating thermal cooling of active equipment having internal side-to-side air cooling arrangements.

17 Claims, 7 Drawing Sheets

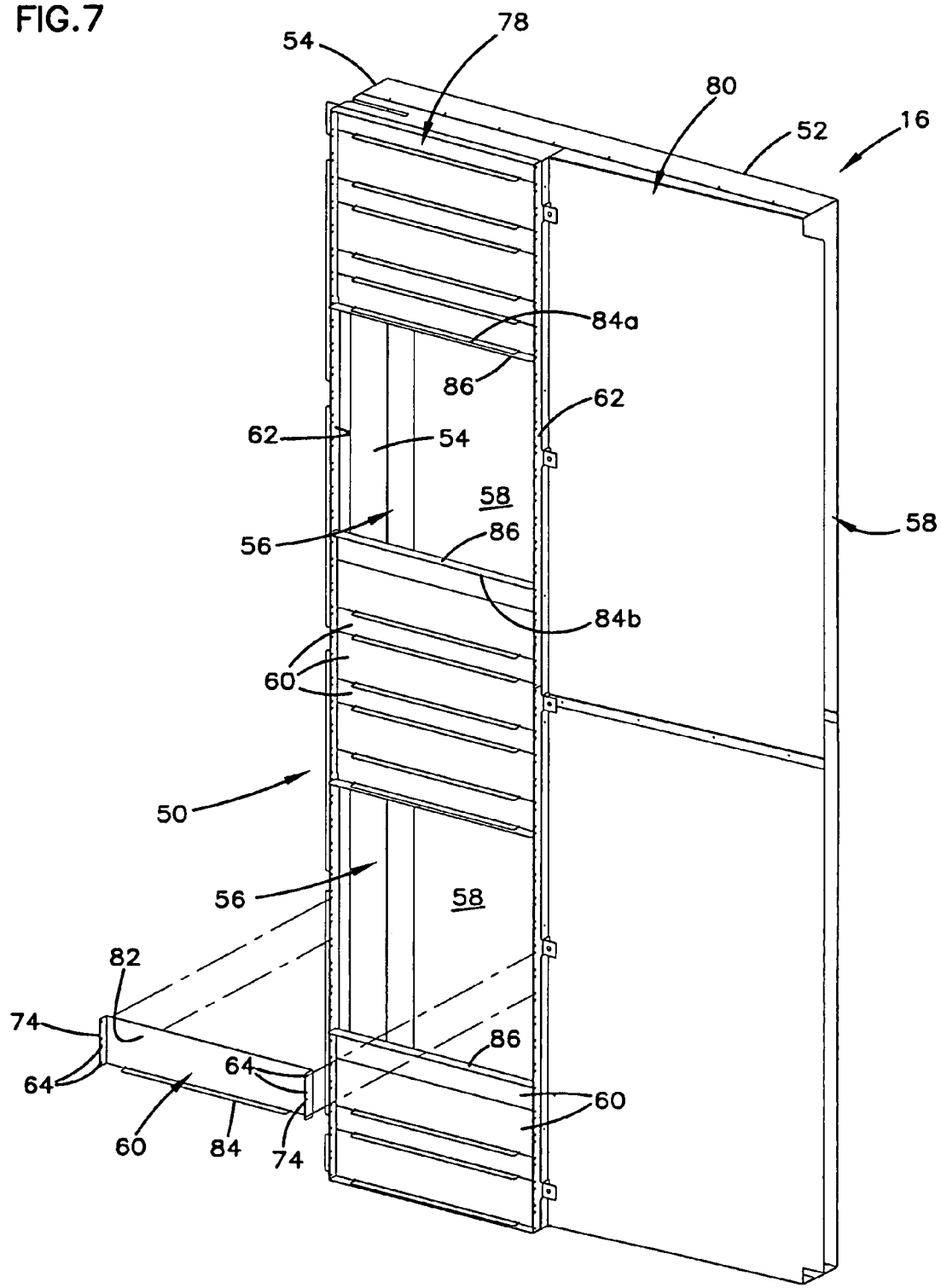

TELECOMMUNICATION CABINET WITH AIRFLOW DUCTING

CROSS-REFERENCE TO RELATED APPLICATIONS

This application is a continuation of application Ser. No. 11/799,099, filed Apr. 30, 2007, now U.S. Pat. No. 7,764,495, issued Jul. 27, 2010; which application is incorporated herein by reference.

FIELD OF THE INVENTION

This disclosure relates to equipment structures for use in the telecommunications industry, and associated methods. More specifically, this disclosure relates to a telecommunications cabinet that houses telecommunications equipment.

BACKGROUND OF THE INVENTION

Telecommunications equipment can generate a significant amount of heat and requires large volumes of air for cooling. Due to limited space in telecommunication facilities, telecommunications equipment is typically stacked within cabinets that are aligned side-by-side. Cabinets are typically enclosed by panels that generally protect the housed equipment.

As can be understood, dissipation of heat generated by the equipment is critical to maintaining proper operation of the equipment. Yet, the side-by-side arrangement of cabinets and/or the enclosed construction of cabinets can impede the circulation of airflow necessary for thermal cooling. Side panels are often made of a solid construction, however, many cabinets are designed with front and rear panels that accommodate airflow. For example, some cabinets include mesh front and rear panels that aid in circulating air through the cabinet for cooling purposes. While this solution may be adequate for equipment having internal front-to-rear cooling arrangements, it does not solve air circulation problems associated with equipment having internal side-to-side cooling arrangements.

Improvement of equipment structures to better manage thermal cooling requirements for equipment having internal side-to-side cooling arrangements is needed.

SUMMARY OF THE INVENTION

The present disclosure relates to a telecommunications cabinet that houses telecommunications equipment having an internal side-to-side cooling arrangement. One feature of the cabinet relates to an airflow ducting arrangement located inside the cabinet. The airflow ducting arrangement isolates the heated air exhaust generated by the equipment from the remainder of the cabinet interior. The heated air exhaust is directed out the rear of the cabinet, opposite the region where cool air is drawn into the cabinet.

Another feature of the cabinet relates to the provision of a versatile and adaptable airflow ducting arrangement that accommodates a variety of equipment configurations. The airflow ducting arrangement includes a number of removable plates that can be selectively removed to provide an airflow opening into a heated-air expansion region. The removed plates can also be replaced or re-installed and other plates selectively removed to re-locate the airflow opening to accommodate replacement equipment, for example, having a different heat exhaust configuration.

A variety of examples of desirable product features or methods are set forth in part in the description that follows, and in part will be apparent from the description, or may be learned by practicing various aspects of the disclosure. The aspects of the disclosure may relate to individual features as well as combinations of features. It is to be understood that both the foregoing general description and the following detailed description are explanatory only, and are not restrictive of the claimed invention.

BRIEF DESCRIPTION OF THE DRAWINGS

FIG. 7 is a rear perspective view of the airflow ducting arrangement of FIG. 6, shown with portions of an inner wall removed.

DETAILED DESCRIPTION

Reference will now be made in detail to exemplary aspects of the present disclosure that are illustrated in the accompanying drawings. Wherever possible, the same reference numbers will be used throughout the drawings to refer to the same or like parts.

Figure 1:
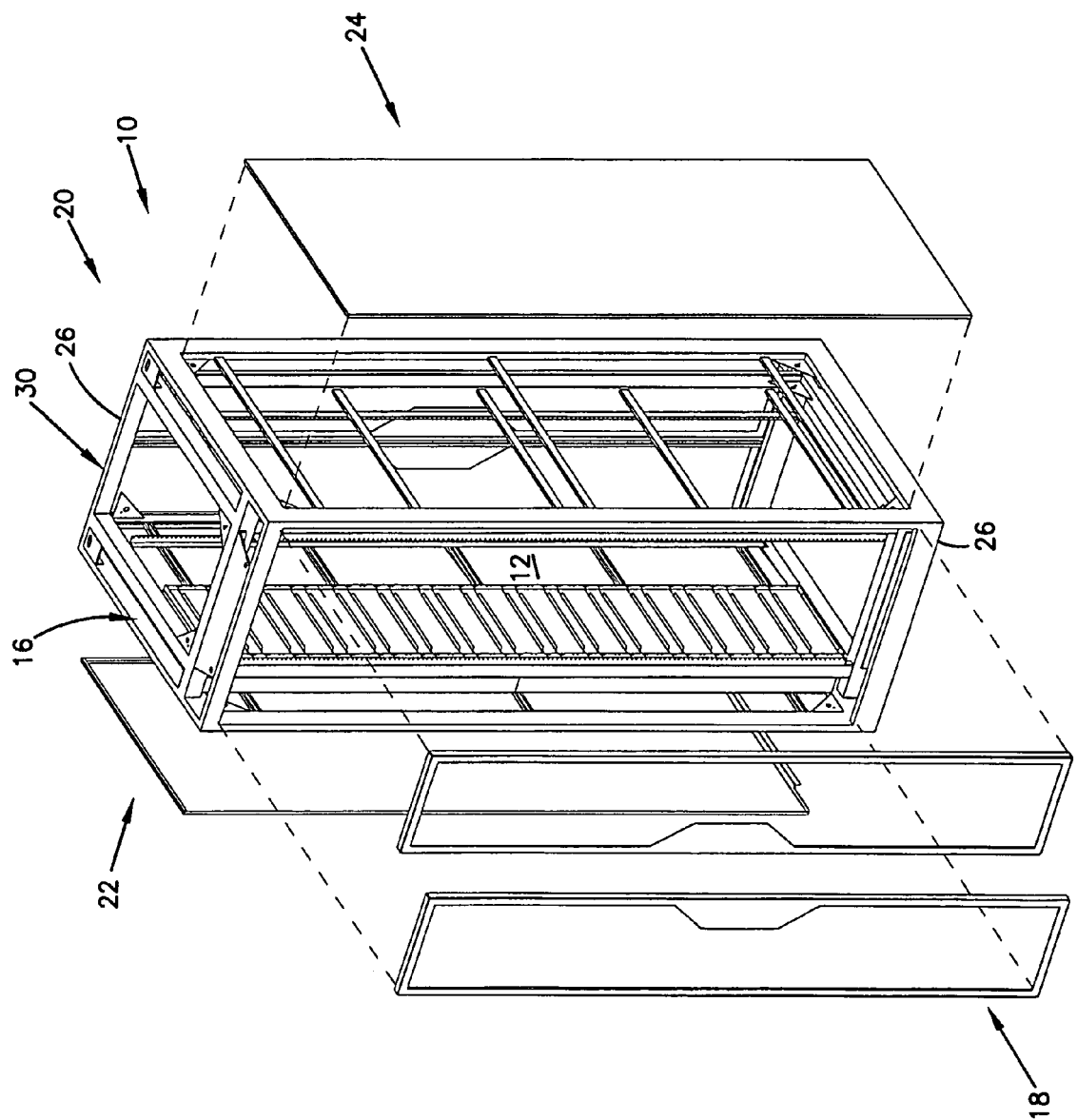
FIG. 1 is a front perspective view of a telecommunications cabinet including an airflow ducting arrangement, in accordance with the principles disclosed.

FIG. 1 illustrates one embodiment of a telecommunications cabinet 10 in accordance with the principles disclosed. The cabinet 10 generally has an interior 12 in which telecommunications equipment 14 (FIG. 3) is located. An airflow ducting arrangement 16 is also provided in the interior 12 of the cabinet 10. The ducting arrangement 16 facilitates airflow through the cabinet to aid in maintaining the thermal requirements of the telecommunications equipment.

While the present disclosure is directed toward a telecommunications cabinet, it is to be understood that features related to the airflow ducting arrangement can be utilized in other applications as well. For example, the disclosed thermal cooling features can be utilized with equipment that is mounted to a telecommunications rack, mounted in a wall-mount box, or mounted to other equipment enclosures or framework.

Referring still to FIG. 1, the cabinet 10 has a front 18, a rear 20, a first side 22, a second opposing side 24, a top 26, and a bottom 28. The front 18 and the rear 20 of the cabinet are defined by mesh panels or doors constructed to facilitate airflow passage through the cabinet interior 12. The sides 22, 24 of the cabinet are also defined by panels. The side panels are typically made of a more solid construction that can impede or obstruct airflow. While the disclosed cabinet is illustrated with panels, as will be understood, the principles disclosed can be utilized in framework constructions that do not have enclosing panels.

Figure 2:
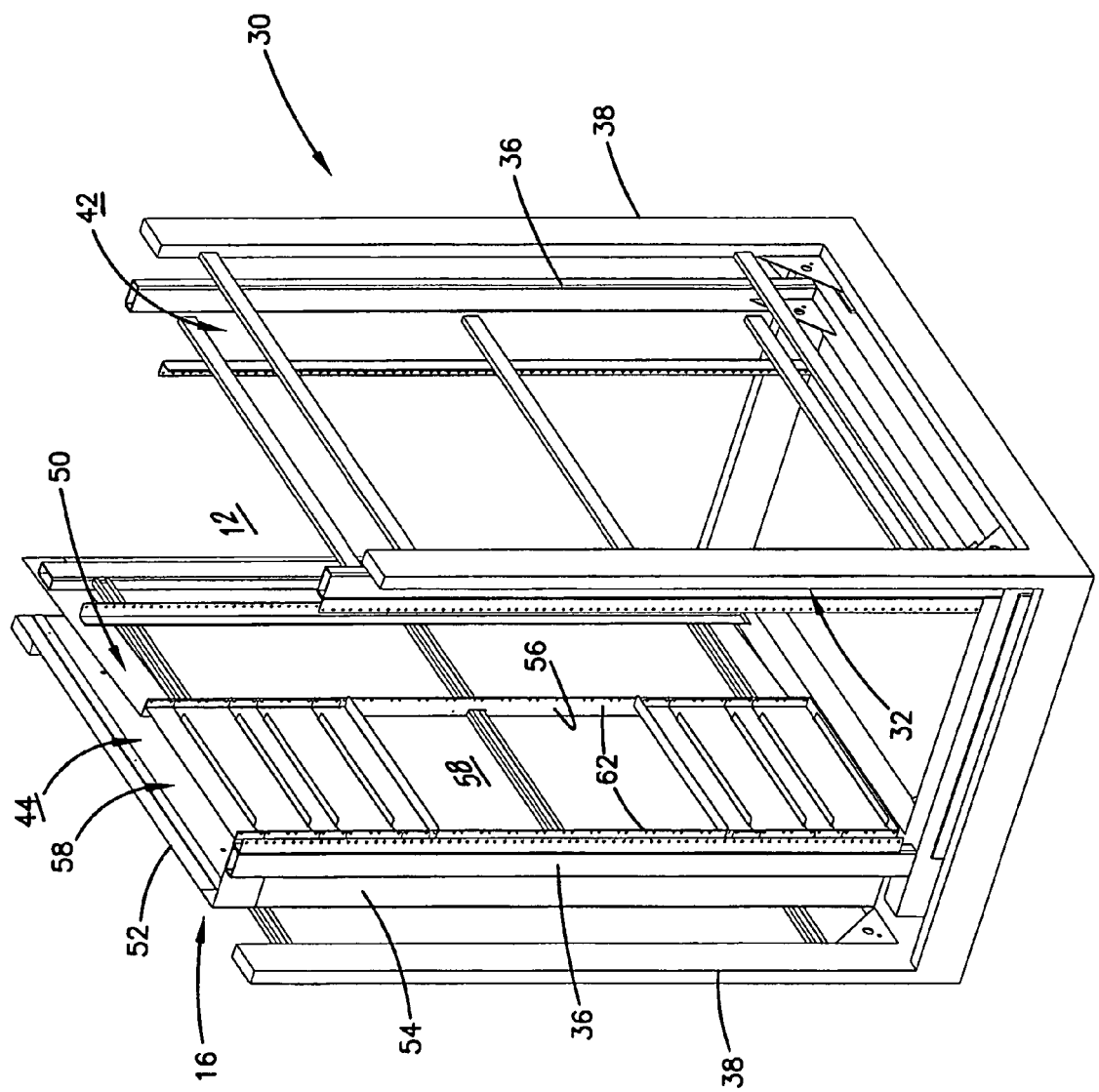
FIG. 2 is a partial front perspective view of a telecommunications frame and the airflow ducting arrangement of the telecommunications cabinet of FIG. 1.
Figure 3:
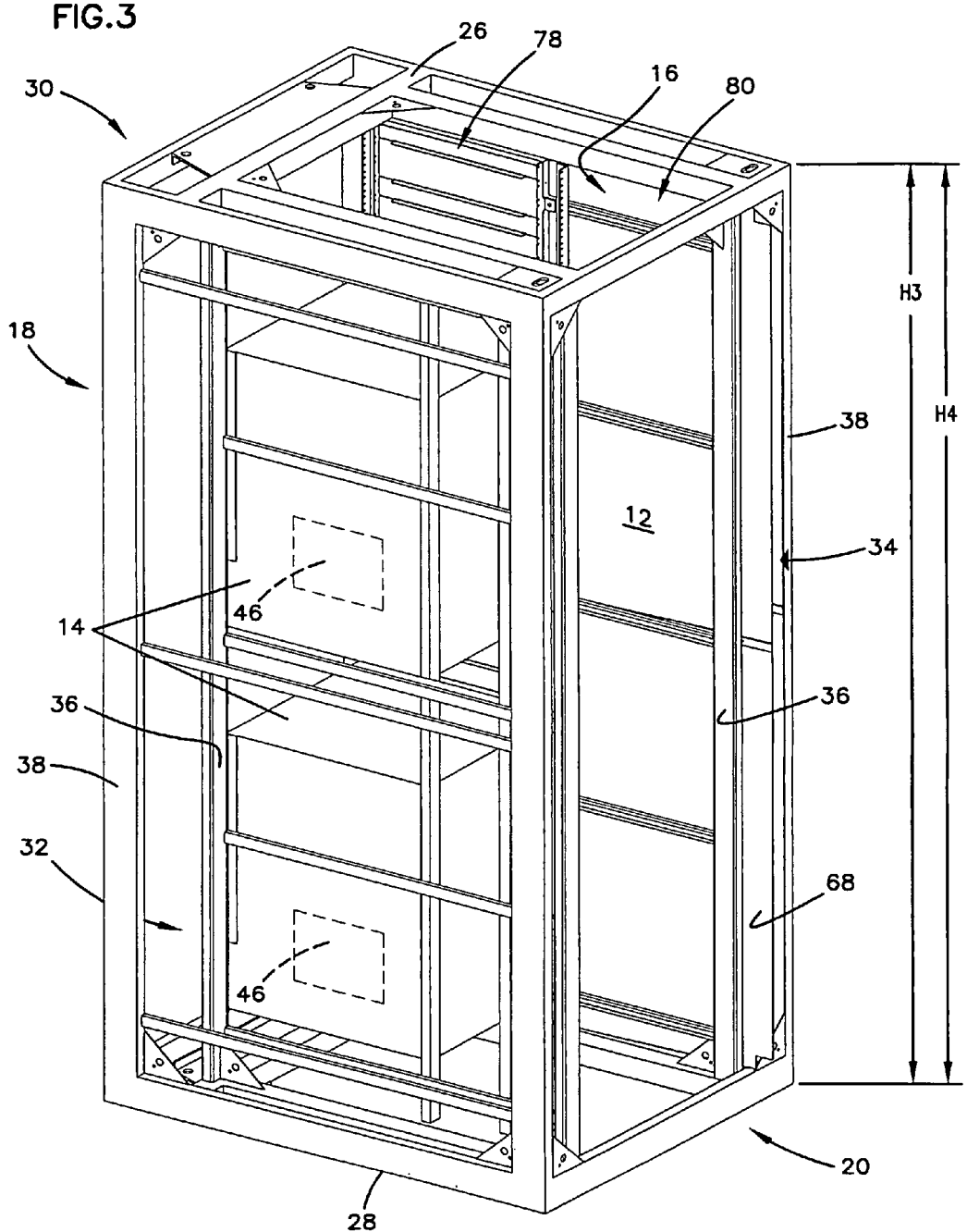
FIG. 3 is a rear perspective view of the telecommunications frame and the airflow ducting arrangement of the telecommunications cabinet of FIG. 1, schematically illustrating telecommunications equipment mounted to the telecommunications frame.

Referring now to FIGS. 1-3, the panels of the cabinet are secured to a frame assembly 30. The frame assembly 30 defines an air inlet region 32 (FIG. 3) and an air outlet region 34. Further details of one particular frame assembly that can be used in accordance with the principles disclosed are described in U.S. Publication No. 2008/0265720, which application is incorporated herein by reference.

The air inlet and air outlet regions 32, 34 of the cabinet 10 are associated with the front 18 and rear 20 of the cabinet. In particular, the air inlet region 32 is in fluid communication with the environment at the front 18 of the cabinet, and the air outlet region 34 is in fluid communication with the environment at the rear 20 of the cabinet. In the illustrated embodiment, fluid communication is provided by the construction of the front and rear panels; i.e., the front and rear panels are made of a mesh construction that accommodates airflow into and out from the interior 12 of the cabinet 10.

Figure 4:
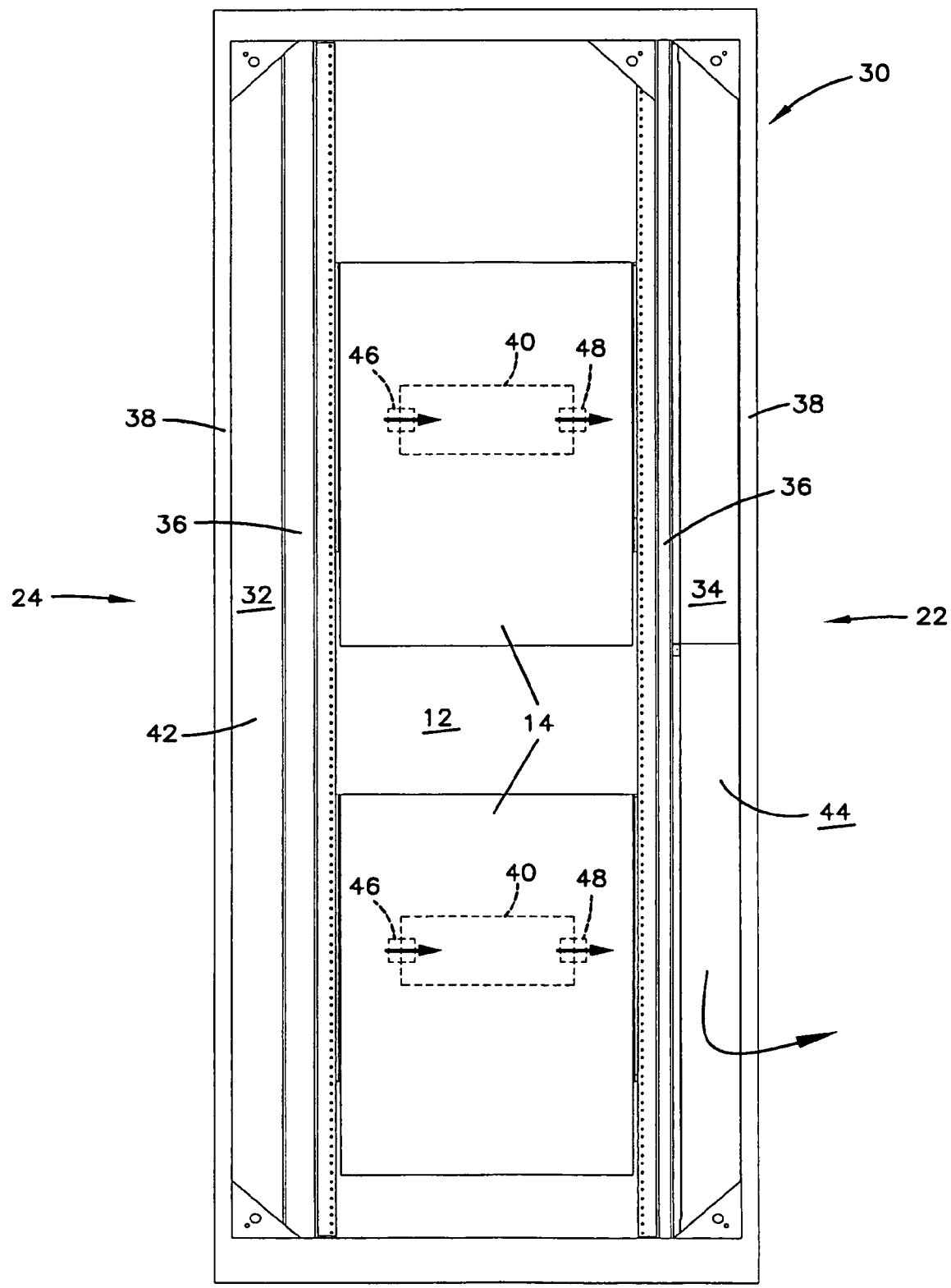
FIG. 4 is a rear elevation view of FIG. 3.

Referring to FIGS. 3 and 4, the air inlet region 32 of the cabinet 10 is defined by a volume of space 42 located adjacent to the second side 24 of the cabinet, while the air outlet region 34 is defined by a volume of space 44 located adjacent to the first side 22 of the cabinet. The volumes of space 42, 44 are in turn defined between eight vertical frame members of an inner frame 36 and an outer frame 38 of the frame assembly 30.

Figure 5:
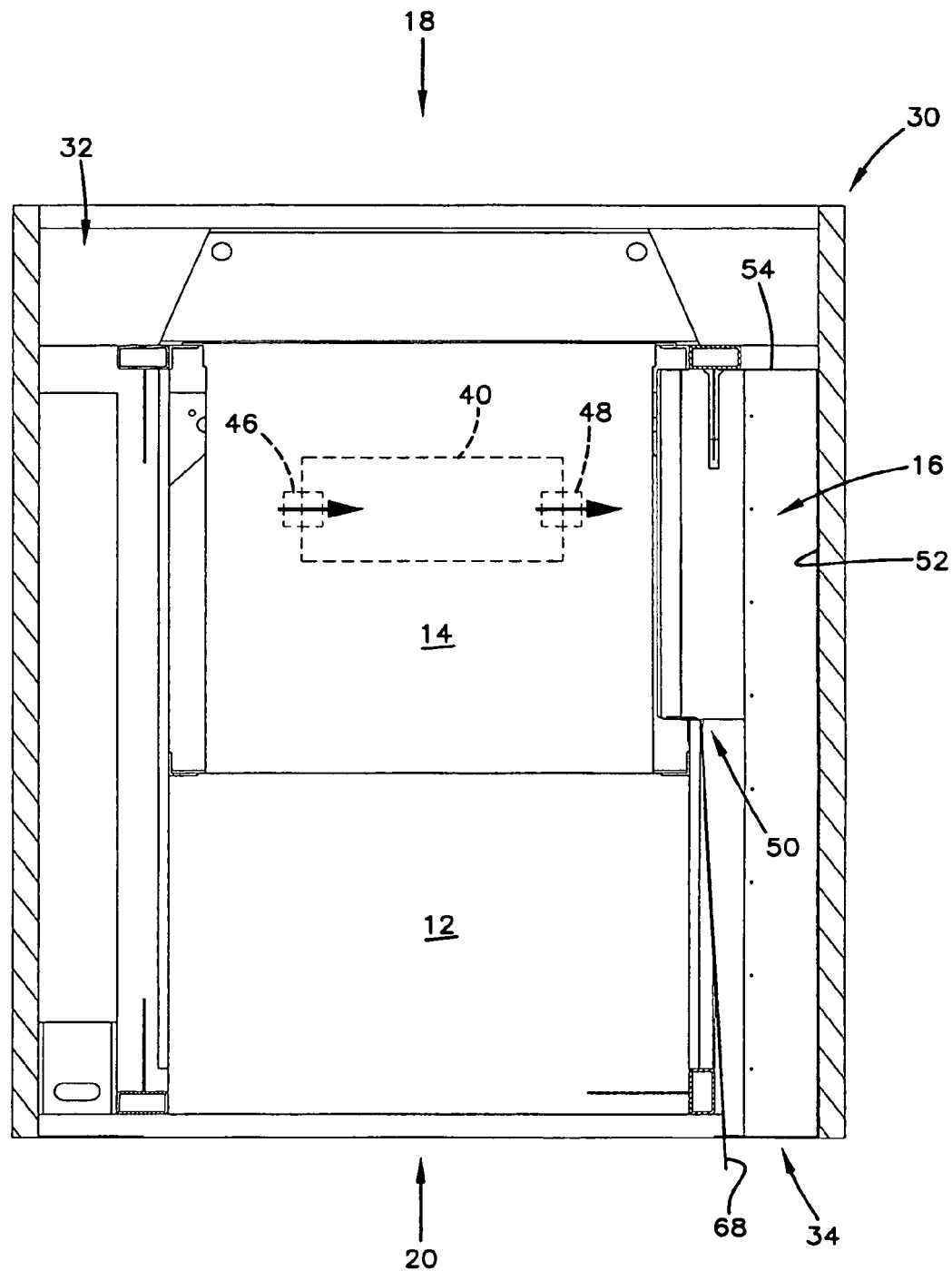
FIG. 5 is a top plan view of the telecommunications frame and the airflow ducting arrangement of FIG. 4.

Referring back to FIGS. 1 and 3, the airflow ducting arrangement 16 of the present disclosure is located in the interior 12 of the cabinet at the air outlet region 34. In telecommunication facilities, space is limited and cabinets (e.g., 10) are often placed side-by-side. The present airflow ducting arrangement 16 is located entirely in the interior 12 of the cabinet 10. Accordingly, the airflow ducting arrangement 16 does not have structure(s) projecting from the cabinet exterior that would otherwise take-up valuable and limited facility space. As shown in FIG. 5, a majority of the airflow ducting arrangement is further located within the foot print of the frame assembly 30; that is, only a deflection shield portion 68 of the airflow ducting arrangement 16 extends beyond the frame assembly 30. The deflection shield portion 68 extends a short distance (less than about 2 inches) from the frame assembly 30 to aid in directing heated exhaust air away from the primary interior region of the cabinet 10. The deflection shield portion 68 of the airflow ducting arrangement 16 is still, however, located within the footprint of the cabinet 10 when the rear panel is attached, so as to not expand upon the cabinet's spatial requirements.

Referring back to FIG. 3, in use, the telecommunications equipment 14 (schematically represented in dashed line) is located with the cabinet interior 12 between the air inlet region 32 and the air outlet region 34. In the illustrated embodiment, the equipment 14 mounts to the inner frame 36 of the frame assembly 30. The equipment 14 can include active equipment, such as switching or patching equipment, for example. Active telecommunications equipment is equipment that utilizes electrical power and therefore generates heat during operation or use.

Cabinets loaded with equipment are often placed in facilities in side-by-side arrangements, as space within such facilities is limited. As can be understood, placement of the cabinets in a side-by-side arrangement obstructs side-to-side airflow through the cabinets, regardless of the cabinet's side panel constructions. Accordingly, airflow into the cabinet 10 and out from the cabinet is facilitated through the front 18 and rear 20 of the cabinet.

Heat dissipation and thermal cooling are critical to maintaining acceptable operating conditions for active equipment. Some types of active equipment have internal air cooling arrangements that function to maintain proper operation temperatures. The disclosed cabinet 10 is particularly useful for telecommunications equipment 14 having internal side-to-side air cooling arrangements 40 (schematically represented in FIGS. 4 and 5).

Because equipment cabinets are often placed side-by-side, telecommunications equipment having side-to-side air cooling arrangements present a thermal-cooling challenge, as access to cool air or even sufficient airflow can be obstructed due to the placement of adjacent cabinets. In the present cabinet arrangement, the airflow ducting arrangement 16 facilitates and directs airflow through the cabinet to reduce or eliminate air circulation problems associated with internal side-to-side cooling arrangements. Referring to FIGS. 4 and 5, the illustrated telecommunications equipment 14 is located in the cabinet interior 12 such that an inlet 46 (schematically represented; see also FIG. 3) of the side-to-side cooling arrangement 40 is positioned adjacent to the air inlet region 32 of the cabinet. A heated-air outlet 48 (schematically represented) of the side-to-side cooling arrangement 40 of the equipment 14 is positioned adjacent to the airflow ducting arrangement 16 at the air outlet region 34 of the cabinet.

Figure 6:
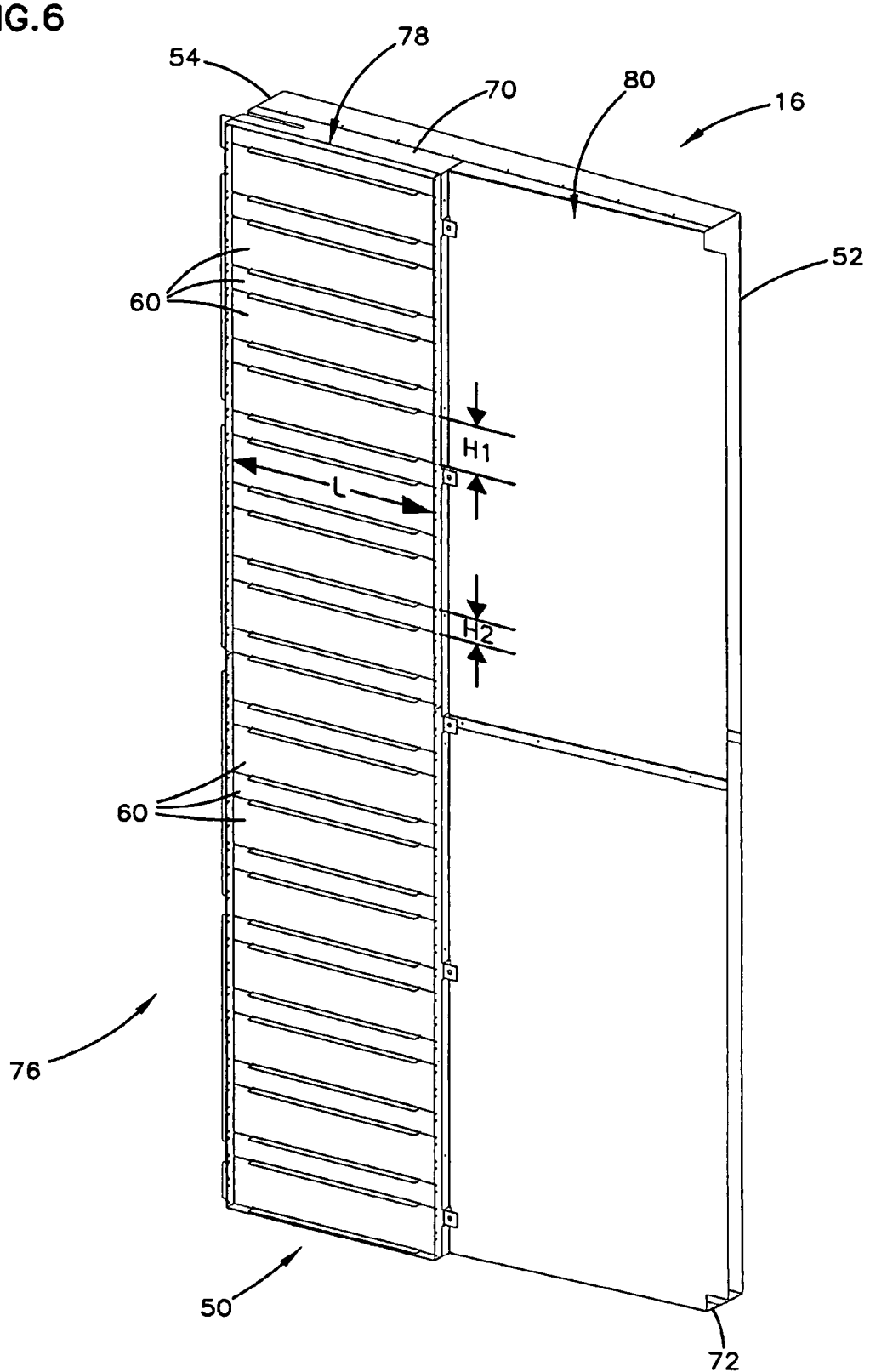
FIG. 6 is a rear perspective view of the airflow ducting arrangement of FIG. 1, shown in isolation.

Referring now to FIGS. 2 and 5, the airflow ducting arrangement 16 generally includes an inner wall 50, an opposing outer wall 52, and a front wall 54 that interconnects and extends between the inner and outer walls 50, 52. The rear of the airflow ducting arrangement 16 is open. When positioned in the interior 12 of the cabinet, the airflow ducting arrangement 16 separates the air outlet region 34 from the remainder of the cabinet interior 12 (including the air inlet region 32). As shown in FIG. 6, the airflow ducting arrangement 16 can also be provided with a top wall 70 and a bottom wall 72.

Referring now to FIGS. 6 and 7, the inner wall 50 of the ducting arrangement is made up of a first section 78 and a second section 80. The first section 78 is located adjacent to the front 18 of the cabinet 10 (see also FIG. 3); the second section 80 is located toward the rear 20 of the cabinet. The second section 80 of the inner wall 50 is constructed to fixedly attach or secure to the frame assembly 30. In contrast, the first section 78 is easily configurable; that is, the first section 78 is non-fixedly attached to the frame assembly 30 so that the inner wall 50 can be adapted to accommodate the different dimensions and structure of various types and sizes of equipment.

In particular, the first section 78 includes a plurality of discrete blocking plates or sections 60 (e.g., wall portions or inserts). The plates 60 are removable and detachably secure to vertical support members 62 (FIG. 2) of the frame assembly 30. In one embodiment, the plates 60 are detachably secured by a pin and slot arrangement; however, other fastening devices and arrangement can be used in accordance with the principles disclosed. In the illustrated embodiment, the plates 60 includes slots 64 (FIG. 7) that are formed in mounting flanges 74; the slots 64 are sized to receive pins or fasteners (not shown) provided on the vertical support members 62.

Referring to FIG. 6, the removable plates 60 have a length L and a height (e.g., H1, H2). The length L of each of the plates 60 is generally the same and extends a distance so as to accommodate the air outlet configurations 48 of a variety of different equipment 14; yet, that plates are not so lengthy so as to leave a gaping opening through which heated air can escape back into the primary interior of the cabinet 10. In one embodiment, the length L of the plates 60 is between about eight inches and twenty-four inches; in the illustrated embodiment, the length L of the plates is about fifteen inches.

The height H3 of the plates 60, however, can vary. In the illustrated embodiment, plates are provides with two different heights. The differing plate heights aid a user in better adapting or customizing the airflow ducting arrangement to the particular requirements of the equipment. For example, one piece of equipment 14 may have an outlet 48 that requires the removal of only a single plate. The user can select between a single taller plate and a single shorter plate, whichever better suits the particular outlet configuration of the equipment. Likewise, another piece of equipment may have an outlet that requires the removal of a number of plates; the number of plates being a combination of taller and shorter adjacent plates. The combination can include, for instance, one shorter plate and one taller plate, more taller plates than shorter plates (e.g., two taller plates and one shorter plate), or more shorter plates than taller plates (e.g., two shorter plates and one taller plate).

In one embodiment, the plates 60 are all between one rack unit and eight rack units in height. A rack unit (RU) is generally a unit a height that is descriptive of the amount of vertical height a component occupies on the rack. One rack unit is typically about 1.7 inches in height. In the illustrated embodiment, the shorter plates are one RU in height, i.e., about 1.7 inches in height (H2), while the taller plates are 2 RUs in height, i.e., about 3.5 inches in height (H1). Other dimensional configurations can be utilized in accordance with the principles discloses. In addition, only a single height plate configuration or a configuration of plates having more height variations (e.g., three or more heights) can also be provided by the plurality of plates 60.

In use, the cabinet 10 is provided with a full set 76 of plates 60. Equipment 14 is then installed in the cabinet interior 12. Depending upon the vertical location of the heated-air outlet 48 (FIG. 4) of the equipment 14, one or more selected plates 60, located adjacent to the heated-air outlet 48 of the equipment 14, are removed to define an airflow opening 56 (FIGS. 2 and 7) in the inner wall 50. The opening 56 facilitates airflow from the outlet 48 of the side-to-side air cooling arrangement 40 of the equipment 14 to the air outlet region 34 (i.e., into the airflow ducting arrangement 16) of the cabinet 10. The remaining plates 60, in addition to the second section 80 of the inner wall 50, prevent the recirculation of heated exhaust air back into the cabinet interior 12.

Referring to FIG. 7, the plates 60 each include a main blocking portion 82 and a ledge or flange 84. The ledge 84 extends along a horizontal edge of the main blocking portion 82. The mounting flanges 74 of the plates 60 are symmetrically constructed so that plate 60 can be mounted such that the ledge 84 is located above the main blocking portion 82 or is located below the main blocking portion of the plate 60. The ledge 84 functions as a handle so that the user can easily grip the plate during removal or placement of the plate 60. The ledge 84 also functions as a strengthening member that adds structural rigidity to the thin construction of the main blocking portion 82 of the plate 60.

In addition, as shown in FIG. 7, ledges (e.g., 84a, 84b) of upper and lower plates 60 that define an airflow opening 56 can be opposingly oriented toward the opening 56. Sealing elements 86, such as gaskets or foam sealant tape, for example, can be secured or adhered to the opposing ledges 84a, 84b. In the alternative, sealing elements can be secure or adhered to the edge of the main blocking portion 82 opposite the ledge 84. The sealing elements 86 generally seal against the exterior of the equipment 14 to prevent the heated exhaust air from re-circulating into the primary interior of the cabinet.

The inlet 46 of the cooling arrangement 40 of the equipment 14 draws in cool air from the air inlet region 32, which is in fluid communication with the facility environment at the front 18 of the cabinet 10. The front wall 54 of the airflow ducting arrangement 16 blocks air from exiting the front 18 of the cabinet; the heated exhaust air instead can only exit at the rear 20 of the cabinet. In facilities having a number of cabinets 10 aligned side-by-side, the directional heat exhaust of the present airflow ducting arrangement 16 essentially permits the cabinet structures themselves to define a heat dissipating region in the facility (located behind the cabinets) separate from a cool air intake region (located in front of the cabinets). The separation of the heat dissipation and cool air intake regions of the facility increases cooling efficiencies due to the reduction in heated air re-circulation.

The airflow ducting arrangement 16 of the present cabinet 10 is also designed to reduce airflow impedance and back pressure so that the cooling arrangement 40 of the equipment 14 operates as efficiently as possible. In particular, the walls 50, 52, 54 of the airflow ducting arrangement 16 at least partially define an expansion region 58 (FIGS. 2 and 7) that is sized to prevent back pressure. In the illustrated embodiment, referring back to FIG. 3, the cabinet 10 has an overall height H3 of about seven feet. The overall height H3 is defined between the top 26 and the bottom 28 of the cabinet. The expansion region 58 of the airflow ducting arrangement 16 has a height H4 that extends along a substantial majority of the height H3 of the cabinet 10 (e.g., at least 85 percent of the height of the cabinet). In the illustrated embodiment, the height H4 of the expansion region 56 is also about seven feet. The expansion region 56 spans the height of the cabinet 10 to provide a large volume into which heated air is exhausted, the large volume reducing back pressure problems associated with smaller constricting volumes.

In general, the present cabinet arrangement provides improved thermal cooling for equipment having side-to-side cooling arrangements. The airflow ducting arrangement is further universal in that arrangement can be configured to match the particular specifications of different types and sizes of equipment. That is, the location of the airflow opening 56 of the airflow ducting arrangement 16 is adjustable by selectively removing one or more plates 60 from the inner wall 50. In the illustrated embodiment of FIGS. 3 and 7, two airflow openings 56 are provided; the location of each airflow opening 56 corresponding to the location of the heated-air outlet of two pieces of equipment 14. As can be understood, more airflow openings can be provided in the airflow ducting arrangement for cabinets housing more equipment.

In addition to be being universal to a variety of types and sizes of equipment, the airflow ducting arrangement 12 of the present cabinet is also adaptable. That is, the airflow openings 56 can be moved to accommodate new or modified equipment. For example, in the event equipment is replaced, the removed plates 60 that define the first airflow opening can be placed back in position, and a different plate or set of plates removed to provide a new airflow opening at a different location that corresponds to the outlet of the new equipment (e.g., a location above or below the original location).

The above specification provides a complete description of the present invention. Since many embodiments of the invention can be made without departing from the spirit and scope of the invention, certain aspects of the invention reside in the claims hereinafter appended.

What is claimed is:

1. A telecommunications cabinet arrangement for holding telecommunications equipment having an internal side-to-side air cooling arrangement, comprising:

a) a cabinet having a front, a rear, and opposing first and second sides that define a cabinet interior, the cabinet including a frame that defines an air inlet region and an air outlet region each in airflow communication with the cabinet interior, the air inlet region being located at the second side of the cabinet such that airflow enters the interior in a direction from the second side of the cabinet, the air outlet region being located at the first side of the cabinet such that airflow exits the interior in a direction toward the first side of the cabinet; wherein cooling airflow from the environment enters via the front of the cabinet and is received into the air inlet region located at the second side of the cabinet, and heated airflow from the air outlet region located at the first side of the cabinet is routable out of the cabinet via the rear of the cabinet to the environment; and b) an airflow ducting arrangement located in the cabinet interior, the airflow ducting arrangement including an inner wall and an opposing outer wall that separate the air outlet region from the remainder of the cabinet interior, wherein the inner wall includes a first section and a second section, wherein the first section of the inner wall includes a plurality of plates, the plurality of plates selectively defining an inner wall airflow opening, and the plurality of plates selectively adjustable to adjust the size of the airflow opening to facilitate airflow from an outlet of the side-to-side air cooling arrangement to the air outlet region.

2. The cabinet arrangement of claim 1, wherein the airflow ducting arrangement includes a front wall extending between the inner and outer walls, and wherein exhaust air from equipment mounted in the cabinet interior is directed to exit the cabinet at the rear.

3. The cabinet arrangement of claim 1, wherein the plurality of plates includes a plurality of removable plates and wherein removal of one or more plates adjusts the size of the airflow opening.

4. A telecommunications cabinet arrangement, comprising:

a) a cabinet having a front, a rear, and opposing first and second sides that define a cabinet interior, the cabinet including a frame that defines an air inlet region and an air outlet region each in airflow communication with the cabinet interior, the air inlet region being located at the second side of the cabinet such that airflow enters the interior in a direction from the second side of the cabinet, the air outlet region being located at the first side of the cabinet such that airflow exits the interior in a direction toward the first side of the cabinet, the cabinet having a height, wherein cooling airflow from the environment enters via the front of the cabinet and is received into the air inlet region located at the second side of the cabinet, and heated airflow from the air outlet region located at the first side of the cabinet is routable out of the cabinet via the rear of the cabinet to the environment; and b) an airflow ducting arrangement located in the cabinet interior, the airflow ducting arrangement including an inner wall and an opposing outer wall that separate the air outlet region from the remainder of the cabinet interior, wherein the inner wall includes a first section and a second section, wherein the first section of the inner wall includes a plurality of plates, the inner wall defining an airflow opening to the air outlet region, wherein the plurality of plates selectively adjust the size of the airflow opening, and wherein the walls of the airflow ducting arrangement define an expansion region having a height that extends along a substantial majority of the height of the cabinet.

5. The cabinet arrangement of claim 4, wherein the plurality of plates includes a plurality of removable plates and wherein removal of one or more plates adjusts the size of the airflow opening.

6. The cabinet arrangement of claim 4, wherein the airflow ducting arrangement includes a front wall extending between the inner and outer walls, and wherein exhaust air from equipment mounted in the cabinet interior is directed to exit the cabinet at the rear.

7. An airflow ducting arrangement that mounts within an electronic equipment cabinet, the arrangement comprising:

a) a ducting structure having an inner wall, an opposite outer wall, a top wall, and a front wall that define an air exhaust region separate from an interior equipment region of an electronic equipment cabinet when mounted within the electronic equipment cabinet, the air exhaust region being located at a first side of the cabinet opposite an intake region located at a second side of the cabinet, the ducting structure defining a sideward airflow opening and a rearward airflow exhaust, the sideward airflow opening providing airflow communication between the interior equipment region in which equipment is mounted and the air exhaust region of the airflow ducting arrangement; and b) wherein the inner wall includes a first section and a second section, wherein the first section of the inner wall includes a plurality of plates, the plates being arranged to define the sideward airflow opening, wherein one or more plates are changeable to selectively adjust the size of the sideward airflow opening, and to selectively locate the airflow opening along a vertical height of the inner wall.

8. The ducting arrangement of claim 7, wherein the inner, outer, and front walls of the airflow ducting arrangement define an expansion region having a height that extends along a substantial majority of the height of the electronic equipment cabinet when mounted within the electronic equipment cabinet.

9. The ducting arrangement of claim 7, further including a deflection shield that directs exhaust air away from the interior equipment region of an electronic equipment cabinet when mounted within the electronic equipment cabinet.

10. The ducting arrangement of claim 9, wherein only the deflection shield extends beyond the footprint of the electronic equipment cabinet.

11. The ducting arrangement of claim 7, wherein the second section includes a construction to fixedly attach the ducting arrangement to the electronic equipment cabinet.

12. The ducting arrangement of claim 7, wherein each of the plates includes a mounting flange that defines a slot used to secure the plate to the ducting structure.

13. The ducting arrangement of claim 7, wherein each of the plates has a height and a length, the lengths of the plates being substantially the same, the heights of the plates varying so as to provide one or more taller plates and one or more shorter plates.

14. The ducting arrangement of claim 7, further including a sealing element located adjacent to the sideward airflow opening that aids in preventing exhaust air from re-circulating into the interior equipment region of the electronic equipment cabinet.

15. The ducting arrangement of claim 14, wherein at least one of the plates includes a ledge oriented adjacent to the sideward airflow opening, the sealing element being located on the ledge of the at least one plate.

16. The cabinet arrangement of claim 1, wherein the second section includes a construction to fixedly attach the ducting arrangement to the electronic equipment cabinet.

17. The cabinet arrangement of claim 4, wherein the second section includes a construction to fixedly attach the ducting arrangement to the electronic equipment cabinet.

\* \* \* \* \*